United States Patent
Bagamery et al.

(10) Patent No.: US 9,261,608 B2
(45) Date of Patent: Feb. 16, 2016

(54) IMAGING APPARATUS, AN APERTURE FOR THE IMAGING APPARATUS AND A METHOD FOR MANUFACTURING AN APERTURE OF AN IMAGING APPARATUS

(75) Inventors: Istvan Bagamery, Budapest (HU); Adam Billing, Budapest (HU); Tamas Bukki, Szendehely (HU); Ferenc Kovacs, Csomor (HU); Zoltan Nyitrai, Budapest (HU); Andras Wirth, Budapest (HU)

(73) Assignee: Mediso Orvosi Berendezes Fejleszto es Szerviz Kft., Budapest (HU)

( * ) Notice: Subject to any disclaimer, the term of this patent is extended or adjusted under 35 U.S.C. 154(b) by 0 days.

(21) Appl. No.: 14/398,296

(22) PCT Filed: Aug. 30, 2012

(86) PCT No.: PCT/HU2012/000083
§ 371 (c)(1),
(2), (4) Date: Oct. 31, 2014

(87) PCT Pub. No.: WO2014/033489
PCT Pub. Date: Mar. 6, 2014

(65) Prior Publication Data
US 2015/0115161 A1    Apr. 30, 2015

(51) Int. Cl.
| | |
|---|---|
| G01T 1/161 | (2006.01) |
| G06F 17/50 | (2006.01) |
| G01T 1/20 | (2006.01) |
| G01T 1/164 | (2006.01) |
| G21K 1/02 | (2006.01) |

(52) U.S. Cl.
CPC .............. *G01T 1/2006* (2013.01); *G01T 1/161* (2013.01); *G01T 1/1648* (2013.01); *G06F 17/50* (2013.01); *G21K 1/025* (2013.01)

(58) Field of Classification Search
CPC ......... G01T 1/20; G01T 1/2006; G01T 1/161; G21K 1/02; G21K 1/025; G06F 17/50
USPC ...................................................... 250/361 R
See application file for complete search history.

(56) References Cited

U.S. PATENT DOCUMENTS

| | | | | |
|---|---|---|---|---|
| 8,067,741 | B2 * | 11/2011 | Beekman | 250/363.1 |
| 2008/0237473 | A1 * | 10/2008 | Uribe et al. | 250/363.1 |
| 2008/0237476 | A1 | 10/2008 | Uribe et al. | |

OTHER PUBLICATIONS

Vunckx K et al; "Optimized Multipinhole Design for Mouse Imaging," IEEE Transactions on Nuclear Science, IEEE Ervice Center, New York, NY, US, vol. 56, No. 5, Oct. 1, 2009.

(Continued)

*Primary Examiner* — David Porta
*Assistant Examiner* — Faye Boosalis
(74) *Attorney, Agent, or Firm* — Wood, Herron & Evans, LLP

(57) ABSTRACT

The invention is an imaging apparatus comprising a detector device (12) for determining points of incidence of photons and having an impact surface (13), and an aperture (16) suitable for projecting the photons to the detector device (12) having an inlet surface (17) and an outlet surface facing the impact surface (13), and comprising pinholes (18', 18", 22) connecting the inlet surface (17) and the outlet surface. The pinholes (18', 18", 22) comprise one or more central pinholes (18', 22) and one or more peripheral pinholes (18"), and at least one central pinhole (18', 22) and at least one peripheral pinhole (18") are formed with focal opening (20', 20", 23) depth or focal opening (20', 20", 23) sizes different from each other. Furthermore, the invention is an aperture for the imaging apparatus and a method of manufacturing an aperture of an imaging apparatus.

19 Claims, 10 Drawing Sheets

(56) References Cited

OTHER PUBLICATIONS

International Search Report and Written Opinion of the International Searching Authority, European Patent Office, May 27, 2013.

European Patent Office, PCT International Preliminary Report on Patentability, Jul. 28, 2014.

* cited by examiner

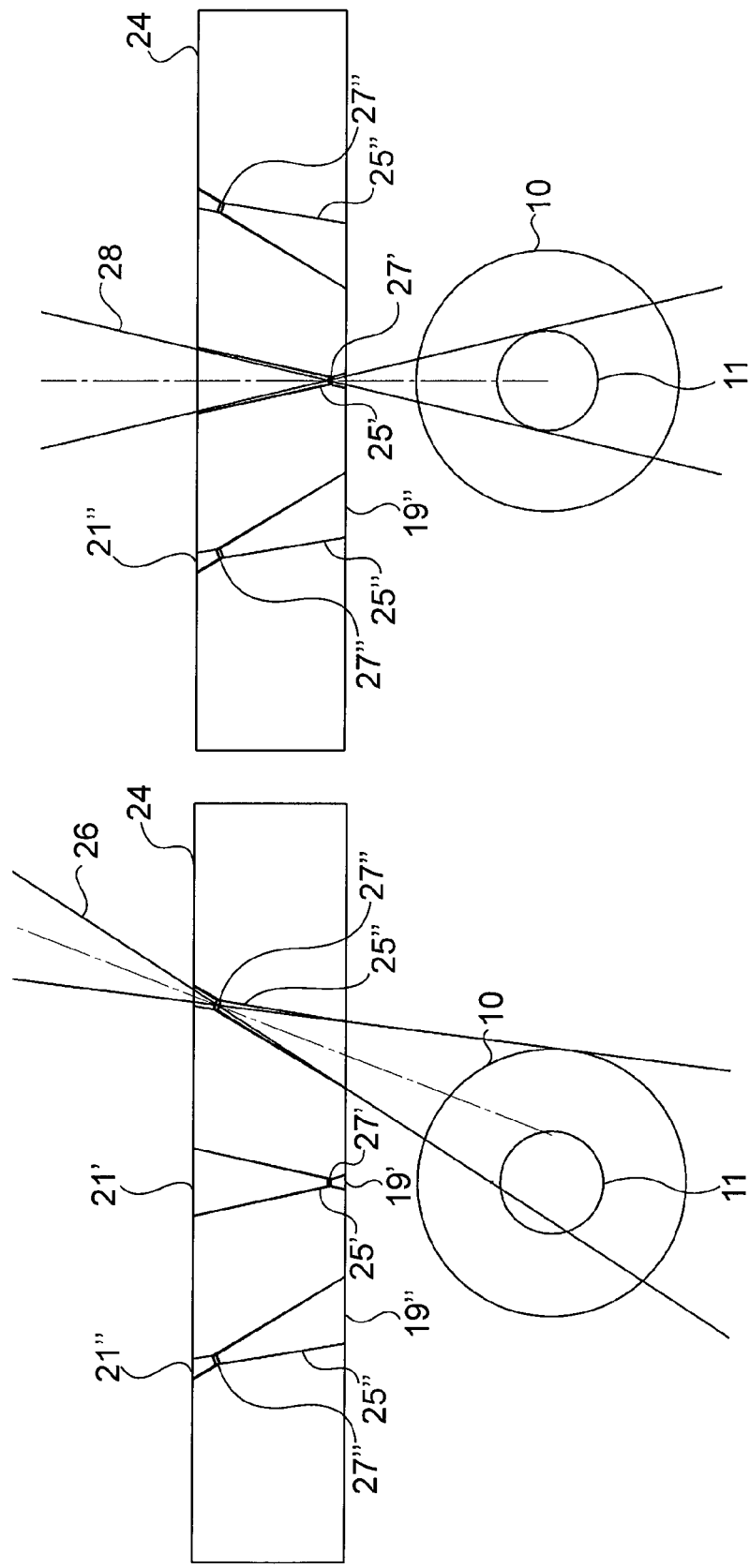

US 9,261,608 B2

IMAGING APPARATUS, AN APERTURE FOR THE IMAGING APPARATUS AND A METHOD FOR MANUFACTURING AN APERTURE OF AN IMAGING APPARATUS

This application claims priority, under Section 371 and/or as a continuation under Section 120, to PCT Application No:PCT/HU2012/000083 filed on Aug. 30, 2012.

TECHNICAL FIELD

The invention relates to an imaging apparatus comprising an aperture with pinholes, an aperture for the imaging apparatus and a method for manufacturing an aperture of an imaging apparatus.

PRIOR ART

The so-called pinhole imaging can be applied in imaging tomography, by way of example in SPECT (Single Photon Emission Computer Tomography) systems. For the purpose of pinhole imaging, a large surface detector device with $R_i$ intrinsic resolution suitable for detecting photons and for determining the incidence positions of photons, by way of example in the case of gamma photons a gamma detector is rotated around the object of interest or patient. The detector device by way of example consists of a scintillation crystal and an array of photodetectors arranged along the scintillation crystal. The photodetectors can be e.g. PMTs (Photomultiplier Tubes). In accordance with the pinhole imaging principle, a so-called aperture is placed in front of the detector device detecting the incidence positions of photons, in the path of the beam of the photons. The aperture is made of a material significantly or principle i.e. practically fully blocking the stream of photons, and this material is lead or tungsten by way of example. The aperture comprises one or more specially formed pinholes routed through the aperture. The pinholes are formed so that from the inlet opening on one side of the aperture and from the outlet opening on the other side of the aperture they gradually become narrower towards the focal opening, which is the smallest cross section opening of the pinhole. One pinhole realizes pinhole imaging and several pinholes realize multi-pinhole imaging.

In pinhole imaging, on the basis of the so-called projection images made from several angles about the examined object, using an imaging apparatus comprising an aperture and a detector device, an appropriate image reconstruction algorithm generates the spatial distribution of the material emitting gamma photons injected into the object, and this provides important information to the expert (a physician or biologist researcher) performing the tomographic examination about the physiological performance of the given organ. An imaging apparatus is an equipment fitted with aperture and detector device, which said apparatus is suitable for imaging a volume of interest by its aperture to the detector device, so as to make a recording or picture of the volume of interest with the detector device, by way of example on the basis of the activity therein.

In pinhole or multi-pinhole imaging, the image of the object placed into the field of view (FOV) is projected by means of the pinhole(s) formed in the aperture by M times magnification to a detector device suitable for determining the position of incidence. The object to be examined is placed into a volume of interest in the field of view. Magnification M can be expressed with lengths characterising the imaging method. M =FD/AF, where FD stands for the distance between the centre of focal opening of a pinhole and the detector device, while AF is the distance between the centre of the rotation mentioned above and the centre of the focal opening. Characteristically, the centre of rotation is located in the examined object.

The accuracy of imaging, i.e. the resolution R measurable in the projection image and re-projected into the image space is determined by intrinsic resolution $R_i$ of the detector device, the effective focal opening diameter $D_{e\!f\!f,r}$ (from the aperture resolution point of view) of the aperture causing blurring, and the magnification M:

$$R \cong \sqrt{\left(\frac{R_i}{M}\right)^2 + D_{e\!f\!f,r}^2\left(1+\frac{1}{M}\right)^2}$$

The value of resolution R characterises the ability of the imaging apparatus, namely: how far must two point sources be away from each other to be able to be definitely separated from each other. Accordingly, the aim is to achieve as low value of the resolution R, as possible. Characteristically, the value of $R_i$ fluctuates around an average value in the function of the position, depending on the location of scintillation as detailed below.

Furthermore, an important image characteristic is the locally changing sensitivity S strongly depending on the space angle $\gamma$ of a given point from which the effective focal opening diameter $D_{e\!f\!f,s}$ of the given pinhole is seen:

$$S \cong \cos^3(\gamma)\frac{D_{e\!f\!f,s}^2}{16r^2}.$$

In the formula, r is the distance between the centre of the pinhole focal opening and a point of the volume of interest, projected to the axis of the pinhole cone, and $\gamma$ is the angle between this axis and the line connecting the given point with the focus. The image characteristics are introduced in more details e.g. in T. Dai et al.: Design and Feasibility Studies of a High-resolution and Low-cost Small Animal SPECT System, *IEEE Nuclear Science Symposium Conference Record* (NSS-MIC), pp. 2698-2701 (2009); R. Accorsi and S. D. Metzler: Analytic determination of the resolution-equivalent effective diameter of a pinhole collimator, IEEE Trans. Med. Imaging, Vol. 23, pp. 750-763 (2004), and S. D. Metzler, J. E. Bowsher, M. F. Smith and R. J. Jaszczak: Analytic determination of pinhole collimator sensitivity with penetration, *IEEE Trans. Med. Imaging*, Vol. 20, pp. 730-741 (2001).

The effective focal opening diameters $D_{e\!f\!f,r}$ and $D_{e\!f\!f,s}$ are larger than the real focal opening diameter, because the photons and hence the gamma radiation penetrates the edges of the characteristically wedge shaped borehole of the pinhole. From the aspect of resolution and sensitivity, the effective focal opening diameter $D_{e\!f\!f}$ can be approximated slightly differently, as referred to by the r and s indicators. The rate of $D_{e\!f\!f}$ depends on the material and density of the aperture, on the opening angle of the pinhole and furthermore on the energy of the photons.

By reducing the focal opening diameter of the pinhole, the sensitivity and the signal to noise ratio are strongly reduced, which deteriorates the diagnostic value of the recording made by the apparatus. At the same time, the decreasing focal opening diameter improves the theoretically achievable resolution R, i.e. the value of R decreases, which improves the diagnostic value of the image as a result of more richness in detail. Finding the optimal focal opening diameter for imaging is a substantial engineering challenge.

It is known by the configuration of pinhole apertures, that the sensitivity of the imaging apparatus is improved by increasing the number of pinholes in the aperture; this is the multi-pinhole technology already mentioned above. The more pinholes contributing to the imaging, the more necessary it is to decrease the rate of magnification M due to the finite surface of the detector device, which leads to a deterioration of resolution R.

It is a precondition of unambiguous reconstruction from the projections that the pictures transferred by projection to the detector device by each pinhole should not be overlapping, as described in K. Vunckx et al.: Effect of Overlapping Projections on Reconstruction Image Quality in Multipinhole SPECT, in: *IEEE Transactions on medical imaging*, Vol. 27, pp. 972-983 (2008). If the projections are not overlapping, the occurrence of so-called artificial products during reconstruction can be avoided. An artificial product is a detail of the image which is created due to the overlapping of the projections with no real object (part) assigned to it in the volume of interest. Such solutions are known, in which a minimal overlap and, simultaneously, an image degradation are allowed, thereby increasing the sensitivity of imaging. Such an approach is described in N. U. Schramm et al.: High-Resolution SPECT Using Multipinhole Collimation, IEEE Transactions on Nuclear Science, Vol. 50, No. 3, pp. 315-320 (2003). In the aperture of the apparatus described in the paper K number of pinholes are arranged in front of the detector device formed to determine the position of incidence in a way that the centres of their focal openings are in a plane. The aperture comprising K pinholes divides the field of view between the pinholes in a partially overlapping way. This has the immediate consequence that when the K number of pinholes have such an arrangement, the sensitivity does not grow K times, because each point of the whole volume of interest is seen by k<K pinholes. The sufficiently high magnification and the associated high relative sensitivity and good resolution are achieved by the apparatus described by the paper through allowing partial overlapping of the images projected by the pinholes to the sensitive surface of the detector device in the course of imaging. Apparatuses allowing overlapping projections are described also in WO 2007/120643 A2 and U.S. Pat. No. 7,199,371.

A small animal multi-pinhole imaging apparatus is described in P. Nillius and M. Danielsson: Theoretical Bounds and System Design for Multipinhole SPECT, IEEE Transactions on Medical Imaging, Vol. 29, pp. 1390-1400 (2010).

If the number of pinholes contributing to the imaging method is K, then the total resolution ($R_t$) and total sensitivity ($S_t$) of the apparatus can be calculated as:

$$R_t = \frac{\sum_{j=2}^{K} S_j R_j}{\sum_{j=1}^{K} S_j}$$

and $$S_r = \sum_{j=1}^{K} S_j$$

It is noted that it may be true onto the actually reconstructed resolution $R_{final}$ that $R_{final} < R_t$, if the reconstruction operator applied during the processing of the image made by the imaging apparatus is able to take into consideration the impacts caused by the final focal opening diameter and the intrinsic resolution $R_i$. Therefore, it is worth to form an imaging apparatus having pinholes with the given imaging characteristics in view of the reconstruction model to be applied. If the resolution deteriorating effects are modelled during the iterative reconstruction, e.g. the point response of imaging, it is possible to partly restore the blurring impacts created by the finite diameter $D_{eff}$ of the focal opening and furthermore by the finite resolution of the detector device. The impacts causing blurring may be in correspondence with a low pass filter on the projected image. In the course of restoring the image, in the forward projecting operator of the iterative (e.g. EM, Expectation Maximization) reconstruction, this effect can be taken into consideration, and by this the reconstructed image can be made sharper. This corresponds to filtering with the inverse of low pass filter causing the blurring, i.e. to high pass filtering. However, due to the substantial noise content of projection images, it is worth combining the sharpening filter with an appropriate (regulating) low pass filter, otherwise the image generated by iterative reconstruction becomes noisy quickly, and its signal content is lost fully after already a few iteration cycles. The regulating filter has contrary effect with the sharpening filter. The larger the noise content of projection images, i.e. the less impact has been collected, the stronger regulation is necessary and therefore the achievable sharpening effect is reduced substantially. Consequently, the noise content of the image strongly restricts the possibility of restoring the resolution. Because the duration of a SPECT examination is limited in practice, characteristically to 5 to 30 minutes, the sensitivity of a single pinhole is characteristically very low and largely depends on the geometric conditions, therefore the noise content of recorded projection images is significant. As a result, the reconstructed resolution highly depends on the sensitivity of the imaging apparatus.

Many imaging apparatuses with multi-pinhole apertures are known. In WO 2011/100044 A2 describes such an aperture with pinholes, the pinholes of which have a conic configuration by way of example, and the pinholes are turned towards a single specific region. The aperture described by the document has pinhole arrangement matching to the detector symmetry.

The pinholes of the aperture described in K. Vunckx et al.: Optimized Multipinhole Design for Mouse Imaging, *IEEE Transactions on Nuclear Science*, Vol. 56, pp. 2696-2705 (2009) have inlet and outlet openings the shape of which can be transferred into each other by affine transformation, and the pinholes are oriented towards a single common point. Affine transformability means that two planar shapes can be transformed into each other by shifting, magnification, rotation and/or shearing. The centres of the focal openings of the apertures according to the document are located on a single focal plane and overlapping emerges in the projection. During the imaging according to the document, an image of a limited volume of interest is made only, to make sure that an image of high resolution is made about the organ or other important detail in the limited volume of interest.

In U.S. Pat. No. 7,786,444 B2 an aperture with pinholes is described, wherein the pinholes are of a 'tilted' configuration, i.e. their longitudinal axes point toward a single point, and they are formed to give a non-overlapping imaging. The document also describes an optimisation procedure to manufacture an aperture with pinholes which ensure non-overlapping imaging, for the projection of different sizes of examined objects (mouse, rat).

In US 2010/0219348 A1 and N. U. Schramm et al.: High-Resolution SPECT Using Multipinhole Collimation *IEEE Transactions on Nuclear Science*, Vol. 50, pp. 315-320 (2003), and T. Dai et al.: Design and Feasibility Studies of a High-resolution and Low-cost Small Animal SPECT System, in: IEEE Nuclear Science Symposium *Conference Record*, pp. 2698-2701 (2009) tilted pinhole arrangements are described also. In accordance with WO 2011/070123 A2 and K. Deprez et al.: The Lofthole: a Novel Shaped Pinhole Geometry for Optimal Detector Usage without Multiplexing and without Additional Shielding, in: *IEEE Nuclear Science Symposium Conference Record*, pp. 3317-3322 (2011), the inlet and outlet openings of the pinholes and the shape of the focal opening, respectively, may not be transferred into each other by affine transformation. In accordance with U.S. Pat. No. 7,579,600 B2 and U.S. Pat. No. 7,145,153 B2, non-overlapping imaging is accomplished with building in of partition walls.

In the Hungarian patent description P 09 00574 it is disclosed that by using the detector device comprising a scintillator and photodetectors associated to each other, the closer the centre line of the beam falling onto the detector device to the centre of the area between the photodetectors, the higher is the achievable detection accuracy.

In the above mentioned paper, P. Nillius: Theoretical Bounds and System Design for Multipinhole SPECT, in: *IEEE Transactions on medical imaging*, Vol. 29, pp. 1390-1400 (2010), projections without overlapping are described also. In accordance with U.S. Pat. No. 5,245,191 it is necessary to arrange the pinholes on the aperture placed in front of the detector device in such a way that the spots projected to the detector device should not be overlapping.

In the pinhole aperture arrangement described in U.S. Pat. No. 7,964,850 B2, the photons generated in the scintillation crystal are guided by light conductors from the scintillation crystal to the detector. In U.S. Pat. No. 7,166,846 and U.S. Pat. No. 7,312,456 baffle members are applied to make sure that the beams arriving from the pinholes are not overlapping on the detector device.

In addition to presenting a number of well-known multipinhole arrangements, the dissertation of B. Vastenhouw prepared at the University of Utrecht under the title "Simulation, construction and application of focused pinhole small animal SPECT" describes the so-called U-SPECT apparatus. The U-SPECT apparatus is also described in U.S. Pat. No. 7,145,153 B2. In this apparatus, the pinholes are arranged on a cylindrical aperture. Each of the K number of pinholes on the cylindrical surface sees the same primary part-volume of the volume of interest. To make sure that an object filling the total volume of interest can be subjected to imaging, the examined object is to be moved transaxially vis-à-vis the aperture during the recording, i.e. in a direction perpendicular to the main axis of the cylindrical aperture. Since in this way the recording time T is to be split into j parts, the effective sensitivity increase of the imaging apparatus is not proportional with K, but with K/j in relation to imaging apparatuses having a one pinhole aperture. It is a characteristic of the U-SPECT systems that projections to the detector device are not overlapping due to the application of a special additional shielding collimator.

A non-overlapping projection can be implemented in accordance with the description of K. Deprez et al.: The Lofthole: a Novel Shaped Pinhole Geometry for Optimal Detector Usage without Multiplexing and without Additional Shielding, IEEE Nuclear Science Symposium and Medical Imaging Conference (NSS-MIC), pp. 3317-3322 (2011) and in WO 2011/070123 A2 through a special pinhole configuration, for example by making sure that on the side of the detector device facing the aperture the conic pinholes have square shaped openings, i.e. a non-affine type configuration. According to this approach, it is not necessary to use an additional collimator for non-overlapping projection.

In U.S. Pat. No. 8,067,741 B2 an imaging apparatus is described even allowing appropriate quality imaging of isotopes having a higher energy (511 keV) than that of isotopes generally used in multi-pinhole imaging. In the aperture described in the document, each pinhole is replaced by a pinhole array of smaller opening angle.

An adjustable aperture with pinholes having adjustable cross sectional areas is disclosed in US 2008/0237476 A1.

It is a common disadvantage of prior art imaging apparatuses that the configuration of the pinhole arrangements of their apertures are only determined subject to the size and shape of volume of interest, by adjusting tilting and common focal opening size of the pinholes. By the configuration of the pinhole arrangement of prior art apertures, the special requirements of various types of examination are not taken into consideration.

DESCRIPTION OF THE INVENTION

The primary object of the invention is to provide an apparatus which is free of the disadvantages of prior art solutions.

The object of the invention is to provide an imaging apparatus with an aperture comprising pinholes, which is in one embodiment suitable for imaging the primary volume of interest important for the examination with a better sensitivity and resolution in comparison with the regions outside the volume of interest due to the appropriate configuration of aperture pinhole arrangement. The object of the invention is to make a projection characterised by a nearly identical sensitivity and resolution in the complete volume of interest in a further embodiment.

A further object of the invention is to provide an aperture for the imaging apparatus according to the invention. The object of the invention furthermore is to provide a method by which the aperture of the imaging apparatus can be manufactured.

The objects of the invention can be achieved by the imaging apparatus according to claim 1, the aperture according to claim 10, and the method for manufacturing an aperture of an imaging apparatus according to claim 16. Preferred embodiments of the invention are defined in the dependent claims.

Certain embodiments of the imaging apparatus according to the invention can be used favourably in the examination of such organs, wherein the organ to be examined can be localised in a primary volume of interest smaller than the volume of interest, and at the same time there is significant activity outside the primary volume of interest also, and therefore it is necessary to perform the projection of the whole volume of interest. This scenario is realized by way of example in the case of cardiac examinations. In this case the object is to make sure that within the primary volume of interest, wherein the examined organ is positioned by the examination adjustment, the best possible sensitivity and resolution are accomplished, while in the parts outside the primary volume of interest, but yet within the volume of interest, only a minimally required sampling indispensable for reconstruction is provided.

Other embodiments of the imaging apparatus according to the invention may be advantageously applied in such cases wherein practically uniform sensitivity and resolution are required for the imaging of the volume of interest. This occurs by way of example in the case of examinations of oncology, where pathogen regions and metastasises defined by implying activity parts are sought in the complete volume of interest, and therefore in these examinations the object is to ensure the best possible uniformity of sensitivity and resolution of the projection of the total volume of interest.

In the imaging apparatus according to the invention it is possible as described above to select the imaging characteristics, i.e. the distribution of total sensitivity ($S_t$) and simultaneously the distribution of local resolution ($R_t$) in a way that it is matched to the considerations of the given application.

BRIEF DESCRIPTION OF DRAWINGS

Preferred embodiments of the present invention are described below by way of example with reference to the following drawings, where FIG. 2A is a sectional view of an aperture according to one embodiment of the invention, depicting a projection through a peripheral pinhole, FIG. 2B is a sectional view of an aperture as according to one embodiment of the invention, depicting a projection through a central pinhole.

MODES FOR CARRYING OUT THE INVENTION

Figure 1:
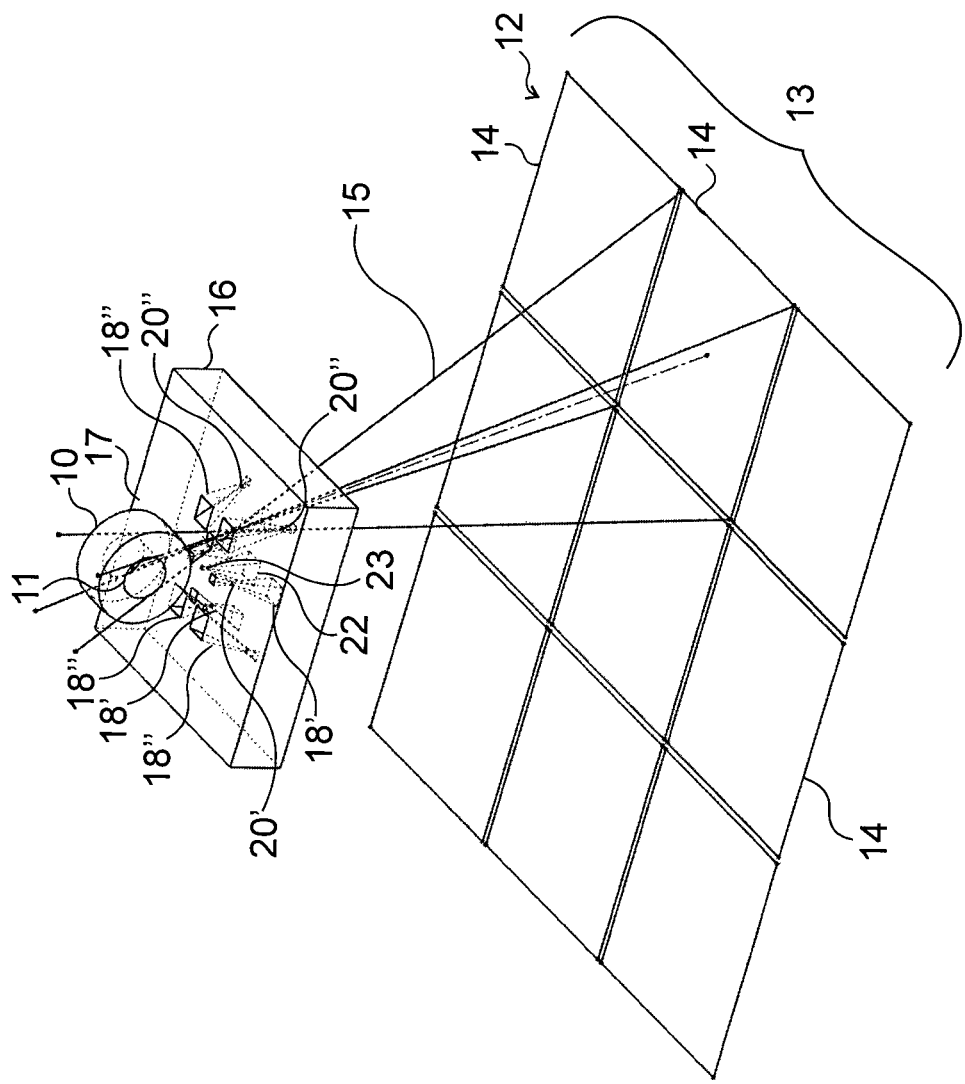
FIG. 1 is a perspective view of one embodiment of the invention, showing a volume of interest and a primary volume of interest.

In FIG. 1 a preferred embodiment of the imaging apparatus according to the invention is shown in a perspective view. The imaging apparatus according to the invention comprises a detector device 12 being suitable for determining the points of incidence of photons and having an impact surface 13, and an aperture according to the invention, in this embodiment the aperture 16. The point of incidence is the point where a given photon hits the impact surface of the detector device 12. The aperture 16 is suitable for projecting the photons to the detector device 12, and has an inlet surface 17 and an outlet surface facing the impact surface 13, and comprises pinholes 18', 18", 22 connecting the inlet surface 17 and the outlet surface.

In the imaging apparatus, the pinholes 18', 18", 22 comprise one or more central pinholes, in this embodiment the pinholes 18', 22, and one or more peripheral pinholes, in this embodiment pinhole 18". According to the invention, at least one central pinhole, in the present embodiment pinholes 18', 22, and at least one peripheral pinhole, in the present embodiment pinhole 18" are formed with focal opening depths or focal opening sizes different from each other. Such a configuration of the focal openings 20', 20", 23 of the pinholes 18', 18", 22 serves for tuning differently the above mentioned parameters of the focal openings 20', 20", 23, the configuration of the pinholes 18', 18", 22 can be matched to the requirements of the type of examination.

In some embodiment of the apparatus according to the invention, the pinholes can also be formed with pinhole inserts located in the appropriately formed openings of the aperture, and they are e.g. made of tungsten. The focal opening size of the pinholes and the distance of the focal opening from the inlet surface and the outlet surface of the aperture are not influenced by configuring the pinhole from the aperture material (e.g. tungsten or lead) or by the application of pinhole inserts. From the aspect of the above parameters of the pinholes it is irrelevant which method is used for their configuration. Applying pinhole inserts is advantageous because they can be produced separately from the aperture made of arbitrary material. In this case, openings housing the pinhole inserts are to be formed in the aperture, and preferably the proper fixing of the pinhole inserts in the openings are to be ensured. By the application of pinhole inserts, the configuration of the pinhole close to the focal opening is identical with the shape of the pinholes obtained by direct machining. According to the two configuration methods, the forming of the pinholes may only deviate close to the inlet surface and outlet surface of the aperture, because the pinhole inserts generally do not protrude until the inlet surface or outlet surface of the aperture. However, the forming of the pinholes close to the inlet surface and the outlet surface is irrelevant from the aspect of imaging. By way of example, the pinholes may be made by computer controlled fibre electrospark machining or by a casting technology (for example, in the case of applying gold or lead inserts).

According to the invention, contrary to prior art solutions, it is not necessary for the centres of the focal openings of pinholes to determine one focal plane in the aperture, and therefore the projection of the aperture is not only determined by the tilting angle of the main axis of the pinholes and by the common size of focal openings. According to the invention we have recognised that the projection of the pinholes of the aperture and through this projection the image characteristics of the image obtainable by the imaging apparatus can be substantially improved by shifting the places of focal openings of pinholes in the aperture from a focal plane or if some of the focal openings are formed with different sizes taking into consideration the type of examination.

The recording made by the imaging apparatus according to the invention may be reconstructed by a reconstruction device connectable to the detector device 12, and suitable for determining the spatial distribution of the photon emitting material in the volume of interest 10 on the basis of the points of incidence of the photons. The reconstruction device is not part of the invention and is not shown in FIG. 1.

In certain embodiments of the invention, the focal opening of at least one central pinhole is located closer to the inlet surface than the focal opening of at least one peripheral pinhole. The distance between a surface and a focal opening is understood to be the distance between the surface and the centre of the focal opening. FIG. 1 shows such an embodiment, with the central pinholes 18', 22 and the peripheral pinholes 18". The aperture 16 comprises nine pinholes 18', 18", 22 in a 3×3 square arrangement. The peripheral pinholes 18" are located at the corners of the square, i.e. closer to the edges of the aperture 16. The focal openings 20" of the peripheral pinholes 18" are located at equal distances from the inlet surface 17 on the side of the aperture 16 facing the volume of interest 10. The central pinhole 22 is located in the centre of the square shaped arrangement, and the central pinholes 18' are at the middle of the sides. The central pinholes are characteristically the pinholes closer to the centre of the aperture. FIG. 1 shows that the focal openings 20', 23 of the central pinholes 18', 22 are closer to the inlet surface 17 than the focal openings 20" of the peripheral pinholes 18". The focal opening 23 of the central pinhole 22 is formed closer to the inlet surface 17 than the focal opening 20' of the central pinholes 18'. The focal openings 20' of the central pinholes 18' are formed at equal distances from the inlet surface 17 of the aperture 16.

FIG. 1 shows a primary volume of interest 11 being a part of the volume of interest 10. In this embodiment, on the impact surface 13 in accordance with the imaging of pinholes 18', 18", 22, non-overlapping image segments 14 are arranged in the same number as the pinholes 18', 18", 22. Each pinhole 18', 18", 22 projects on separate image segments 14. One or more central pinholes, in this embodiment the central pinholes 18', 22 are formed in a way that they perform the complete projection of the primary volume of interest 11 being a part of the volume of interest 10. Accordingly, each central pinhole 18', 22 projects the total primary volume of interest 11 to the associated image segment 14. The peripheral pinholes 18" project only a part of the volume of interest 10 to the associated image segment 14. The pinholes 18', 18", 22 are formed to implement jointly a complete projection of the volume of interest 10 to the detector device 12. The imaging apparatus according to the present embodiment is suitable for recording the spatial distribution of the photon emitting material in the primary volume of interest 11 with better sensitivity and resolution than the photon emitting material in the parts of the volume of interest 10 outside the primary volume of interest 11.

The aperture of the imaging apparatus according to the invention performs the imaging of the total volume of interest to the detector device in the preferred embodiments of the apparatus. Therefore, by applying the apparatus according to the invention, in the case of imaging from a sufficient number of projection directions, contrary to certain prior art imaging apparatuses, in the course of making the record it is not necessary to displace in a trans-axial direction the object to be imaged and the imaging apparatus compared to each other.

In the embodiment shown in FIG. 1, the pinholes 18', 18", 22 have pyramid shape, i.e. from the inlet opening towards the focal opening and from the outlet opening towards the focal opening, respectively, the pinholes are gradually narrower in a pyramid-like manner. The pinholes 18', 18", 22 are formed in a way that on the planar surface providing the impact surface 13 of the detector device 12, they perform the imaging onto nine rectangular shaped image segments 14 practically formed without dead space, covering the whole surface of each image segment 14. A projection 15 to an image segment 14 of a central pinhole 18' is shown in FIG. 1. The figure shows that the central pinhole 18' associated with the projection 15 projects the complete primary volume of interest 11 to the image segment 14 associated with the given central pinhole 18'. Consequently, the nine pinholes 18', 18", 22 arranged in the aperture 16 perform the imaging of the volume of interest 10 in a way that the imaging operations cover in a non-overlapping way, but practically dead-space-free the complete impact surface 13.

In some embodiments of the imaging apparatus according to the invention, the number of pinholes in the aperture and the number of image segments located on the impact surface of the detector device are identical. An image segment is assigned to each pinhole, and the given pinhole projects to its associated image segment. In certain embodiments, the configuration of pinholes in the aperture is such that they provide a non-overlapping projection, i.e. each pinhole projects the volume of interest or one part thereof to the detector device in a way that the image projected by one pinhole is generated within a given image segment. Because on the wall of the pinholes the probability of penetrating photons heavily depends on the energy of the given photon, an overlap-free projection is only ensured with energy determined during the design or a lower one. By way of example, the characteristic energy is 140 keV when $Tc^{99m}$ is used as a photon emitting material, and it is 511 keV when $F^{18}$ is applied as a photon emitting material. By the designation of the pinholes, the material quality of the photon emitting material, i.e. the energy of the emitted photons is to be taken into consideration, because with an increasingly higher photon energy, the edges of pinholes become increasingly more translucent for the photons.

In some embodiments of the imaging apparatus according to the invention, non-overlapping projection is ensured by the configuration of pinholes made from the aperture material, and therefore in the apparatus according to the invention, it is not needed to apply an additional shielding collimator. In some embodiments, the pinholes can example e.g. of conic or pyramid configuration. The conic shape pinholes gradually narrow in a cone-like manner from the inlet opening towards the focal opening and from the outlet opening towards the focal opening, respectively. In the aperture 16 of the embodiment shown in FIG. 1, the inlet windows 19', 19" and the outlet windows 21', 21" and the focal openings 20', 20" of the pinholes 18', 18" are planar which can be transformed into each other by affine transformation. In case of pyramid shape pinholes, the planar shapes are general quadrangles, and in case of conic shape pinholes they are circles or ellipses.

FIGS. 2A and 2B show an aperture 24 with central pinholes 25' and peripheral pinholes 25" as well as the volume of interest 10 and the primary volume of interest 11 being a part thereof in a sectional view. The central pinhole 25' has focal opening 27' and the peripheral pinholes 25" have focal opening 27". FIG. 2A depicts projection 26 implemented by a peripheral pinhole 25", and FIG. 2B shows projection 28 implemented by the central pinhole 25'. The pinhole 25" implementing the projection 26 projects a part of the volume of interest 10 to the detector device (not shown in FIGS. 2A and 2B). FIG. 2B depicts that the central pinhole 25' projects the total primary volume of interest 11 to the detector device with the projection 28.

FIGS. 2A and 2B show sections of the pinholes 25', 25". The pinholes 25', 25" are formed in a way that from the inlet openings 19', 19" and from the outlet openings 21', 21" they gradually narrow towards the focal openings 27', 27". The focal openings 27', 27" of the pinholes 25', 25" are located at their smallest cross section. FIGS. 2A and 2B show that the focal opening 27' of the central pinhole 25' is located in the vicinity of the volume of interest side 10 of the aperture 24, and the focal openings 27" of the peripheral pinholes 25" are arranged close to the opposite side of the aperture 24.

Preferably, the aperture of the imaging apparatus must be taken as close as possible to the volume of interest in order to achieve the largest possible magnification M, because the magnification M is inversely proportional with the distance between the aperture and the volume of interest. The increase of the magnification M is limited by the fact that due to the relatively small size of the preferably applied image segments, the field of view of each pinhole must be substantially restricted. In certain embodiments of the invention, the pinholes jointly implement a complete projection of the volume of interest; this, due to the limited fields of view, may substantially influence the achievable rate of magnification. With a sufficiently large magnification M, one pinhole is able to project characteristically without overlap only one part of the volume of interest, and therefore in order to ensure the complete projection of the volume of interest, the aperture must be formed and arranged in a way that the volume of interest is split among the pinholes, as introduced in detail in FIGS. 3A and 3B.

Figure 4:
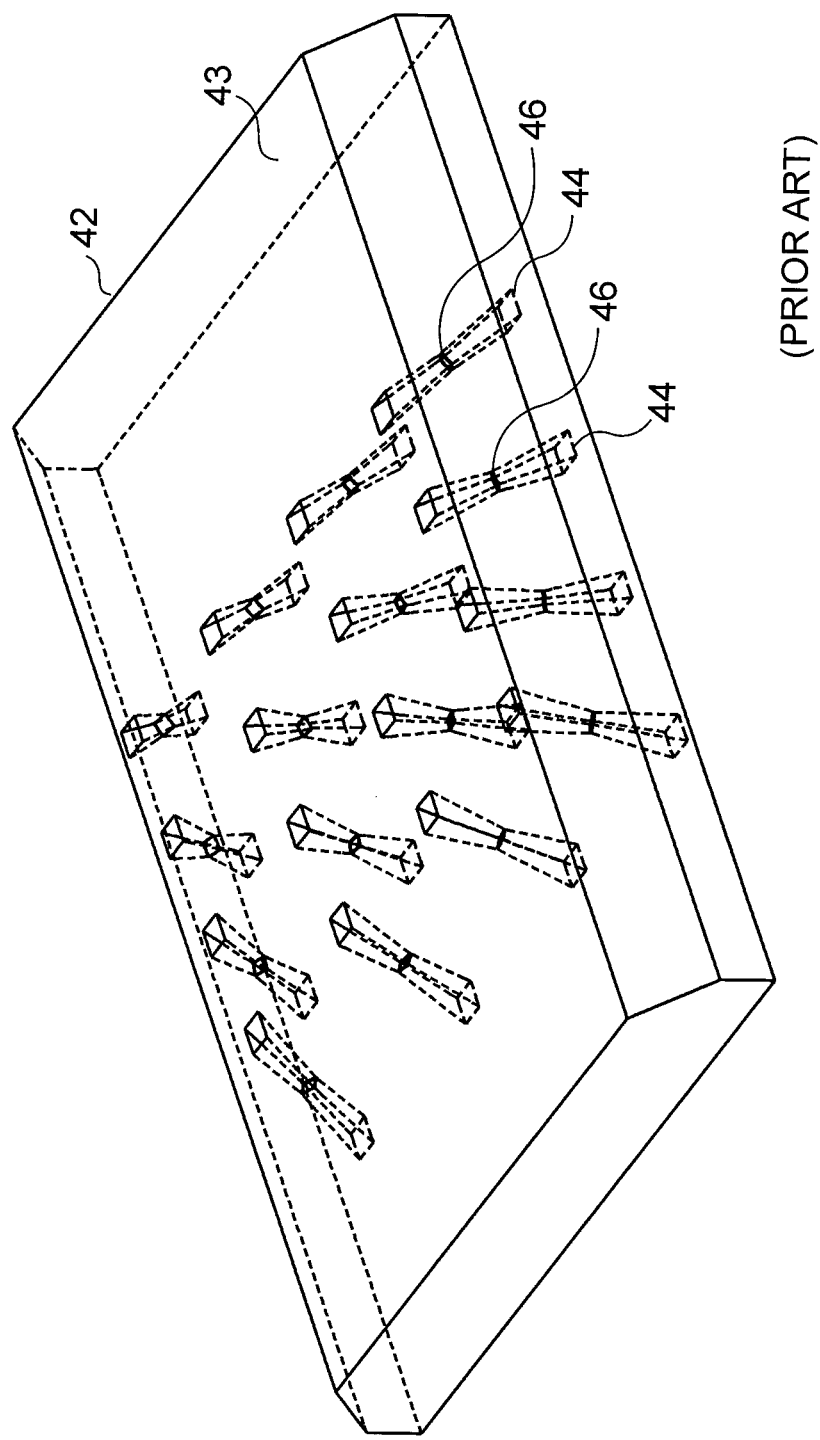
FIG. 4 is a perspective view of a prior art aperture showing the pinholes.

Considering a known reference aperture, in which the centres of the focal openings of the pinholes are in one plane, and furthermore the aperture configuration ensures non-overlapping projection; such an aperture is e.g. a reference aperture 42 shown in FIG. 4. Assume that in this reference aperture, the orientation of pinholes is such that each point of the volume of interest is projected by at least one pinhole to the detector device associated with the aperture, i.e. complete projection can be implemented by the reference aperture. The reference aperture can be formed in a known way so as to meet the requirements above. With a reference apparatus implemented with the reference aperture and an associated detector device, total sensitivity is $S_{t0}$ and total resolution is $R_{t0}$. It is demonstrated that if the focal openings of various pinholes are modified as detailed below, while maintaining complete projection, it applies to the total sensitivity $S_t$ of the so obtained apparatus that $S_t > S_{t0}$, while the total resolution $R_t$ characterising the obtained imaging apparatus is also improved, i.e. $R_t < R_{t0}$.

Figure 3B:
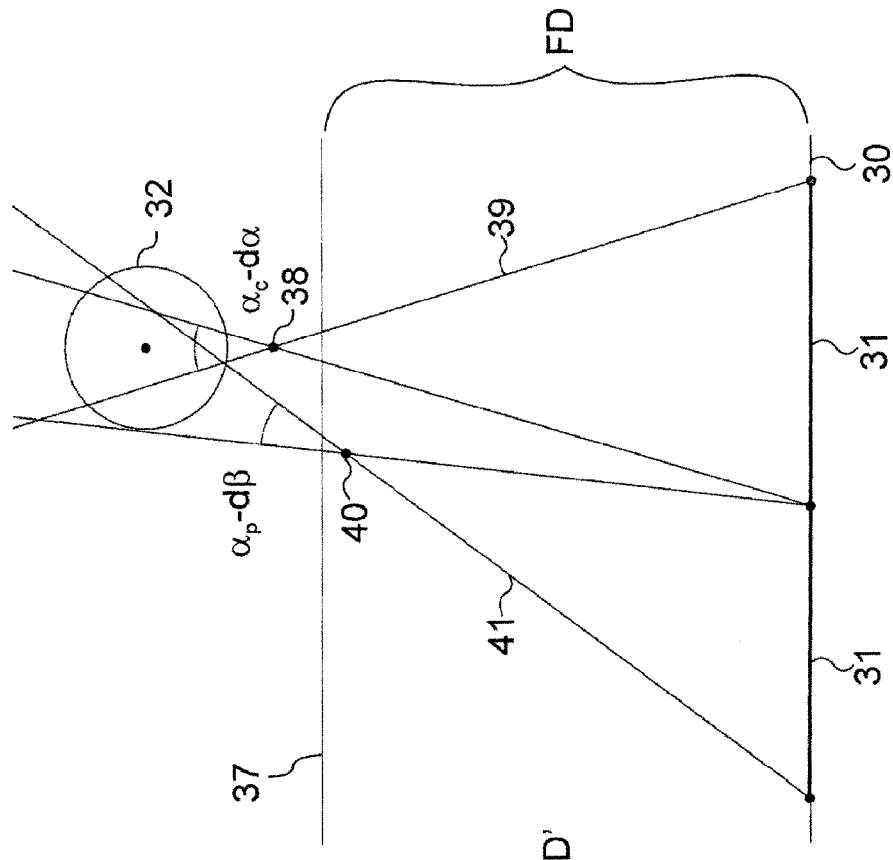
FIG. 3B is a schematic view depicting projection of two pinholes of an imaging apparatus according to one embodiment of the invention.
Figure 3A:
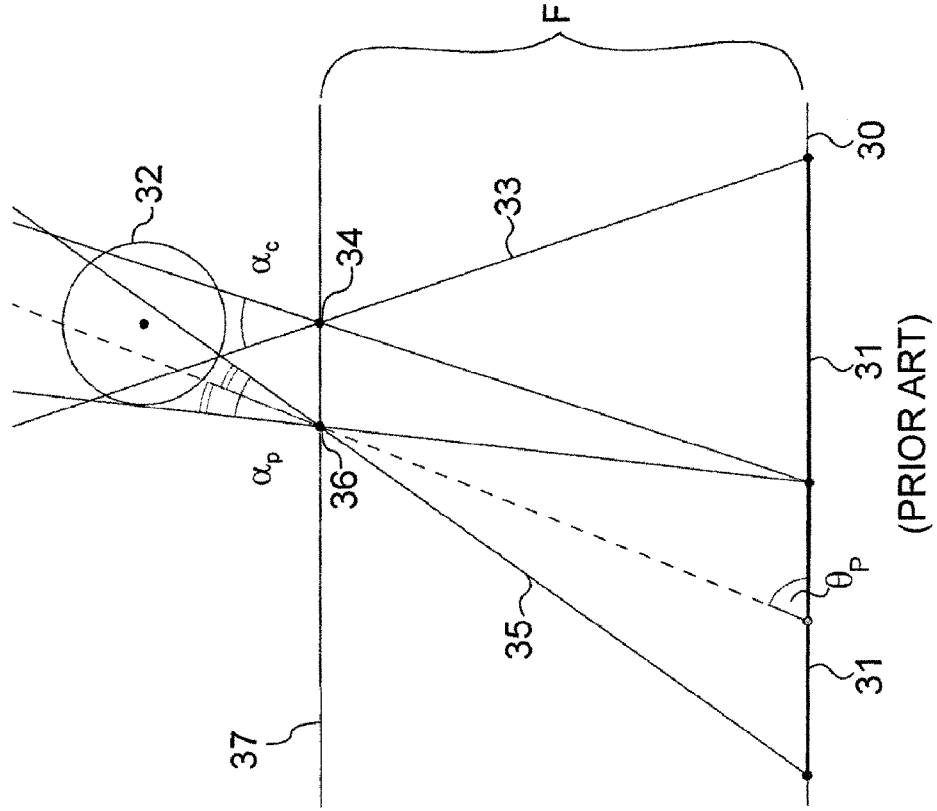
FIG. 3A is a schematic view depicting projection of two pinholes of a prior art imaging apparatus.

The projections performed by the reference aperture pinholes of certain parts of the volume of interest are shown in FIG. 3A in a transaxial view. The projections according to FIG. 3A are implemented by certain prior art imaging apparatuses. In the figure, projections 33, 35 implemented by two pinholes are shown, of which the right hand side one is the projection 33 of a central pinhole with focal opening 34, and the left hand side one is the projection 35 of a peripheral pinhole with focal opening 36. The focal openings 34, 36 are depicted in a point-like manner. In reality, the focal openings have a finite extension. For this analysis of the projection relations, for the sake of simplification, it is advisable to apply point-like focal openings, which is not a restriction respect to the finite focal opening case, from the aspect of our analysis.

The focal openings 34, 36 define focal line 37. FIG. 3A shows an angle of view ac of the central pinhole, and an angle of view $\alpha_p$ of the peripheral pinhole. With a dashed line, the figure shows the main axis of the peripheral pinhole. The main axis of the peripheral pinhole includes a $\theta_p$ angle with an image segment 31 formed on the impact surface 30 and assigned to the given peripheral pinhole, and the main axis (not shown) of the central pinhole includes a $\theta_c$ angle with the image segment 31 associated therewith. The depicted pinholes project certain parts of a volume of interest 32. FIG. 3A shows that the projections 33 and 35 project the volume of interest 32 so that the closer boundary lines of the projections 33 and 35 intersect each other at the boundary curve of the volume of interest 32, in accordance with the depicted section. The projections 33 and 35 ensure in this way that the part of the arc length of the volume of interest 32 'seen' from the detector device between the other boundary lines of the projections 33 and 35 not intersecting each other are subjected to full projection onto the impact surface 30. In this way, the part of the volume of interest 32 covered by the union of the angles of view $\alpha_c$ and $\alpha_p$ is projected onto the impact surface 30. The total volume of interest 32 according to the figure may be projected onto the impact surface 30 through the application of further pinhole(s), but we intend to demonstrate in FIG. 3A the interrelation of projections 33 and 35 only.

FIG. 3B depicts the arrangement of FIG. 3A slightly modified also in transaxial sectional view. By the displacement of a focal opening 34 associated with the projection 33 according to FIG. 3A in the direction towards the volume of interest 32, focal opening 38 is created, and the projection 33 is modified into projection 39, while the angle of view associated with the projection 39 will become $\alpha_c - d\alpha$. For the maintaining of complete projection, it is necessary to displace the focal opening 36 away from the volume of interest 32 to create focal opening 40. A projection 41 is associated with the focal opening 40, and its angle of view associated with the projection 41 will be $\alpha_p + d\beta$. It follows from the completeness condition and the condition $\theta_p < \theta_c$ that $d\beta = \lambda d\alpha$, where $0 < \lambda < 1$. The distance between the centres of focal openings 38 and 40 and the focal line 37 can be regularly expressed as follows:

$$dFD_c \approx FD tg(\alpha_c/2)d\alpha, \text{ and } dFD_p \approx -FD\, tg(\alpha_p/2)\sin(\theta_p)\lambda d\alpha.$$

In the formula, FD is the distance between the focal line 37 and the impact surface. It can be shown by calculations that a change in the total sensitivity and total resolution can be characterised by the following formulae as a result of such a shifting of the focal openings:

$$dS_t \approx 2M\Delta d\alpha$$

and $$dR_t \approx -\frac{M^2(R_i^2 + D_{eff,s}^2(1+M))}{R_t}\Delta d\alpha$$

wherein $$\Delta = S_c tg(\alpha_c/2) - S_p tg(\alpha_p/2)\sin(\theta)\lambda.$$

In the definition of $\Delta$, $S_c$ and $S_p$ are the sensitivities of the central pinhole and the peripheral pinhole, respectively, derivable on the basis of the formula presented at the definition of sensitivity. Because $S_c > S_p$ applies to the central and peripheral pinholes and furthermore $\lambda < 1$, $\alpha c > \alpha_p$, and hence $dS_t > 0$ and $dR_t < 0$, i.e. modifying the projection depicted in FIG. 3A according to FIG. 3B, both the sensitivity and resolution of the projection are improved, i.e. $S_t > S_{t0}$ and $R_t < R_{t0}$ will prevail.

By comparing FIGS. 3A and 3B it can be seen that the projection 39 projects a smaller part of the volume of interest 32 than the projection 33, because the angle of view of the projection 39 is smaller than that of projection 33. Therefore, in the case of the transformation of focal openings depicted in FIG. 3B, by means of the central pinhole, a smaller part of the volume of interest 32 can be projected to the image segment 31 associated with the central pinhole than in the case shown in FIG. 3A. However, thanks to the transformation of focal openings, better sensitivity projection can be performed about the volume projected by the central pinhole with the arrangement shown in FIG. 3B than with the one shown in FIG. 3A. In addition, the total resolution and total sensitivity of the imaging are also improved according to the formula specifying the rate of their change. The shifting of focal opening depicted by FIGS. 3A and 3B is advisably used in the case of imaging such volumes of interest, the central part of which features an activity distribution interesting from the aspect of the examination, and accordingly it is intended to prepare a high resolution and sensitivity imaging about the central part. In this case the boundary of the primary volume of interest can be defined by the equation $\Delta=0$. The primary volume of interest is projected by the central pinhole to the impact surface of the detector device. In the definition equation of $\Delta$, the sensitivities $S_c$ and $S_p$ depend on the spatial co-ordinates, because the sensitivity changes in space. Accordingly, the $\Delta=0$ equation can be brought to the form $z=f(x,y)$, which describes a spatial surface, i.e. the boundary surface of the primary volume of interest. The size and also the effective diameter of the primary volume of interest may be determined by means of the boundary surface equation.

In another embodiment of the invention, the angle of view of the central pinhole is increased. By increasing the angle of view of the central pinhole, the complete projection can be maintained while reducing the angle of view of the peripheral pinhole. In this case the outermost parts of the volume of interest imaged by the peripheral pinholes are imaged with a better resolution and sensitivity than in the case of FIG. 3A. Generally, the sensitivity associated with the central pinholes, as supported by the sensitivity determining equation, is intrinsically higher and accordingly the associated resolution is intrinsically lower than the sensitivity or resolution associated with the peripheral pinholes. By this transformation, the sensitivity and resolution of various pinholes can be approached to each other, i.e. the total volume of interest can be imaged with a more uniform resolution.

The transformation depicted in FIGS. 3A and 3B can also be generalized to spatial case: in the reference aperture projecting the volume of interest with complete projection to K number of image segments, the pinholes are arranged according to decreasing $\theta$ angles (the angle included by the main axis of the pinholes and the impact surface). Next, according to the $\theta$ angles the pinholes are divided into two groups: the central pinholes associated with larger angles and the peripheral pinholes associated with smaller angles. The focal openings of at least some of the central pinholes are displaced closer to the volume of interest, and the focal openings of at least some of the peripheral pinholes are displaced away from the volume of interest (or the other way round, in accordance with the activity distribution in the volume of interest, on the basis of the description above).

In some embodiments, the focal openings of either the central pinhole(s) only or those of the peripheral pinhole(s) only are displaced in a way that the displaced pinhole(s) is (are) formed with a focal opening depth other than that of the other pinholes. If the given embodiment of the imaging apparatus according to the invention implements complete projection, generally the displacement of the at least one central pinhole also necessitates the displacement of at least one peripheral pinhole.

The number of central pinholes and peripheral pinholes is largely influenced by the total number of pinholes and by the symmetry of pinhole arrangement. As a result of the symmetry, several pinholes are associated with a given $\theta$ angle in many cases. When the pinholes are listed in order according to the $\theta$ angle, the pinholes associated with the few largest angles are classified to the group of central pinholes, and the pinholes associated with the few smallest angles are classified to the group of peripheral pinholes. The few largest and smallest angles characteristically represent one or two angle values; in the embodiment depicted by FIG. 1, there are two and one angle values, and in the embodiment of FIG. 6 there is one angle value each. In the latter embodiment, the focal openings of one-half of the pinholes are not transformed compared to the reference aperture.

Such a grouping of the pinholes is also possible, wherein each pinhole is classified to the group of central or peripheral pinholes, and also such a grouping when some of the pinholes remain outside the groups. Applying the first scenario, generally some of the central and peripheral pinholes are transformed. According to the second scenario, generally the focal openings of all the pinholes classified to the central or peripheral pinholes are transformed.

According to the description above, the invention relates to the manufacturing method of an aperture of an imaging apparatus. In the course of the manufacturing method of an aperture according the invention, a reference aperture suitable for projecting photons, having an inlet surface and an outlet surface, and comprising pinholes connecting the inlet surface and the outlet surface is modelled, said reference aperture comprising pinholes with focal openings formed at equal distances from the inlet surface, and one or more central pinholes and one or more peripheral pinholes are selected from the pinholes, and an aperture is defined by displacing in relation to the inlet surface along main axes of the pinholes the focal opening of at least one central pinhole and/or the focal opening of at least one peripheral pinhole, and/or changing the size thereof, and the defined aperture is formed.

In some embodiments of the method for manufacturing an aperture of an imaging apparatus according to the invention, sensitivity and/or resolution obtainable by the reference aperture and detector device are determined by matching the detector device to the reference aperture, and the focal opening of at least one central pinhole and/or the focal opening of at least one peripheral pinhole is displaced in relation to the inlet surface along the main axes of the pinholes and/or the size of which is changed so that the sensitivity and/or resolution obtainable by the defined aperture and the matched detector device are altered in accordance to the examination objective.

Figure 5:
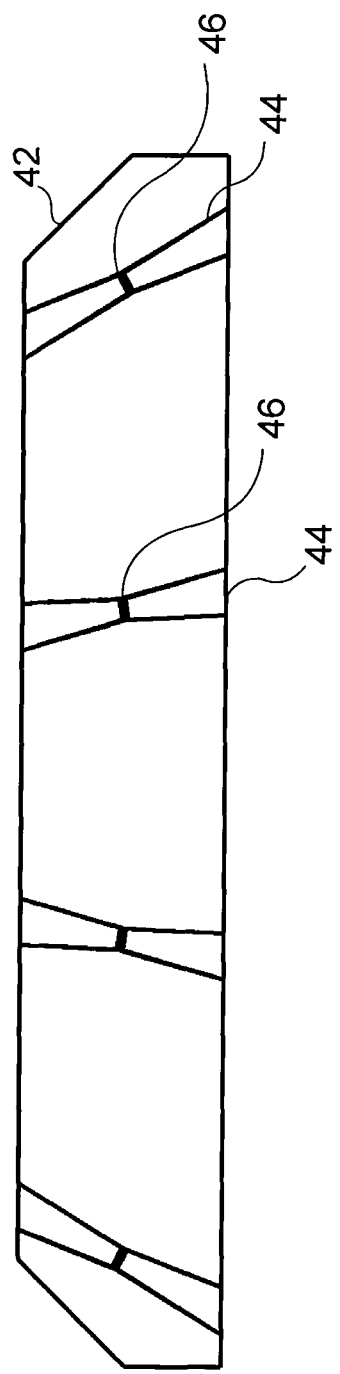
FIG. 5 is the sectional view of the aperture shown in FIG. 4.

FIG. 4 shows a known reference aperture 42, in which sixteen pinholes 44 are formed. Focal openings 46 of the pinholes 44 are formed at equal distances from inlet surface 43 of the reference aperture 42. FIG. 5 shows a sectional view of the reference aperture 42 of FIG. 4. FIG. 5 shows that the centres of the focal openings 46 of the pinholes 44 are arranged in a single plane. The orientation of the pinholes 44 and hence their focal openings 46 are different in order to implement the complete projection.

Figure 6:
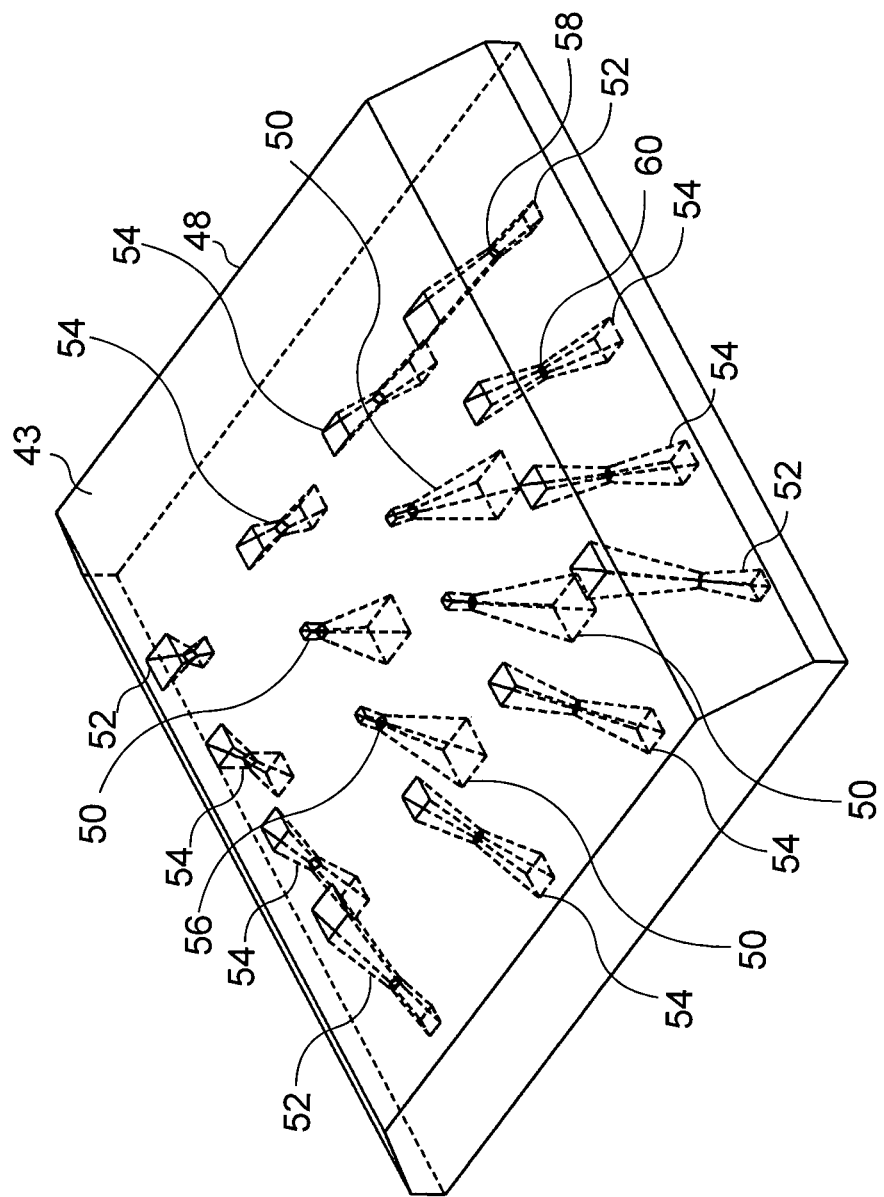
FIG. 6 is the perspective view of an aperture according to one embodiment of the invention showing the pinholes.

FIG. 6 shows an aperture 48 applicable in the imaging apparatus according to the invention and manufactured by the method according to the invention. The aperture 48 can be obtained by applying steps of the method according to the invention as described above, from the reference aperture 42 shown in FIG. 4. It is emphasised that in the method for manufacturing the aperture, the aperture of the imaging apparatus according to the invention is not implemented by the realization of the reference aperture, but the reference aperture is modelled, e.g. by computer programme. Accordingly, envisioning also the transformation detailed above on the pinholes of the reference aperture, it is made by modelling using a computer facility. Therefore, it is only necessary to form, i.e. manufacture/produce the aperture obtained by the transformation of the reference aperture.

Similarly to the reference aperture 42, the aperture 48 comprises sixteen pinholes 50, 52 and 54. From the pinholes 44 of the reference aperture 42, the four pinholes arranged in the centre of the aperture 42 are classified to the group of central pinholes. The pinholes 50 are created by transforming the pinholes 44. Focal opening 56 of the central pinhole 50 is closer to inlet surface 43 of the aperture 48 than the focal openings 46 of the pinholes 44 of the aperture 42 are to the surface 43. From the peripheral pinholes of the reference aperture 42, displacing focal openings 46 of the corner pinholes 44 away from the surface 43, the pinholes 52 can be obtained. Focal opening 58 of the pinholes 52 are farther from the surface 43 than the focal openings 46 from the surface 43. From the remaining pinholes 44, the pinholes 54 with focal opening 60 are obtained without transformation.

Figure 7:
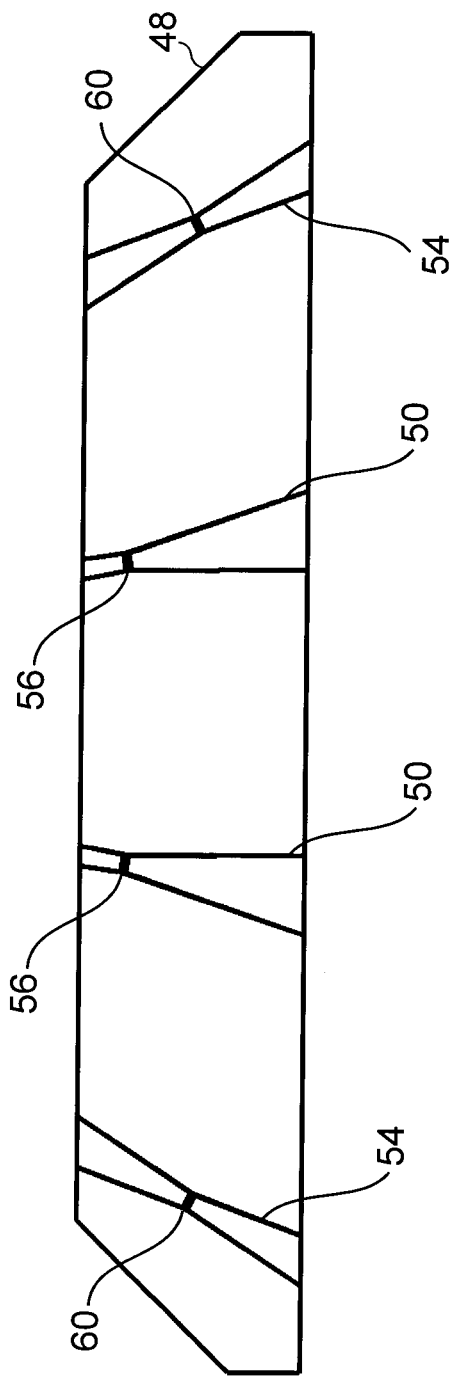
FIG. 7 is a sectional view of the aperture shown in FIG. 6.

FIG. 7 is a sectional view of the aperture 48 shown in FIG. 6. The section is taken along the central pinholes 50 and the peripheral pinholes 54. It is shown in the sectional view that the focal openings of the peripheral pinholes are farther from the surface 43 than the focal openings of the central pinholes. As a result of shifting the focal openings, the pyramids and cones of the pinholes are also altered. In accordance with FIGS. 3A and 3B, the angle of view of the pinholes is changed. The shape of transformed pinholes and therefore the angle of view are determined by the fact that preferably the pinholes project to the same image segment as the pinholes before the transformation.

The extent of displacing the focal openings (displacing them away from or closer to the inlet surface along the main axes of pinholes), and the actual preferred arrangement of pinholes strongly depend on the geometrical conditions of the detector device and on the size of envisaged volume of interest. The size of volume of interest is a function of the given application, by way of example it is different when imaging by way of example the whole body of a mouse/rat or any organ. The imaging apparatus according to the invention may be generalized, of course, for human diagnostic purposes, and by means of this apparatus, for example, a specific SPECT apparatus of appropriately high sensitivity can be formed for example for cardiac or cerebral examinations.

The advantageous characteristic of the imaging apparatus according to the invention is demonstrated below by computer modelling. The useful surface of a scintillation crystal in an examination apparatus specifically formed for examining e.g. a mouse heart, i.e. the impact surface of the detector device is 260×260 mm, which is divided into sixteen image segments by a regular square grid. The aperture is a 10 mm thick wolfram block with pyramid shaped pinholes. In the case of the reference aperture, the centres of the focal openings of pinholes are in a single plane, located at a distance of FD=144 mm from the impact surface of the 6.5 mm thick NaI:Tl scintillation crystal being a part of the detector device. The distance between the centre of rotation and the focal plane is AF=28.5 mm. Hence, the magnification is M =5.05. The aperture projects the 30 mm diameter and trans-axially 13 mm long cylindrical volume of interest to the detector device by complete projection without overlapping.

The focal openings of the four central pinholes of the reference aperture have been moved nearer to the centre of rotation by $dFD_c$=3 mm, while the focal openings of the four pinholes projecting into the image segments located at the corners of the impact surface of the detector device have been moved away from the centre of rotation by $dFD_p$=−1.5 mm, without changing the positions of the other 8 pinholes, thereby forming the aperture of the imaging apparatus according to the invention. Accordingly, a similar transformation has been carried out on the aperture as between the apertures of FIGS. 4 and 6. The focal openings of pinholes are all rectangles of 0.74 mm×0.84 mm size.

Figure 8:
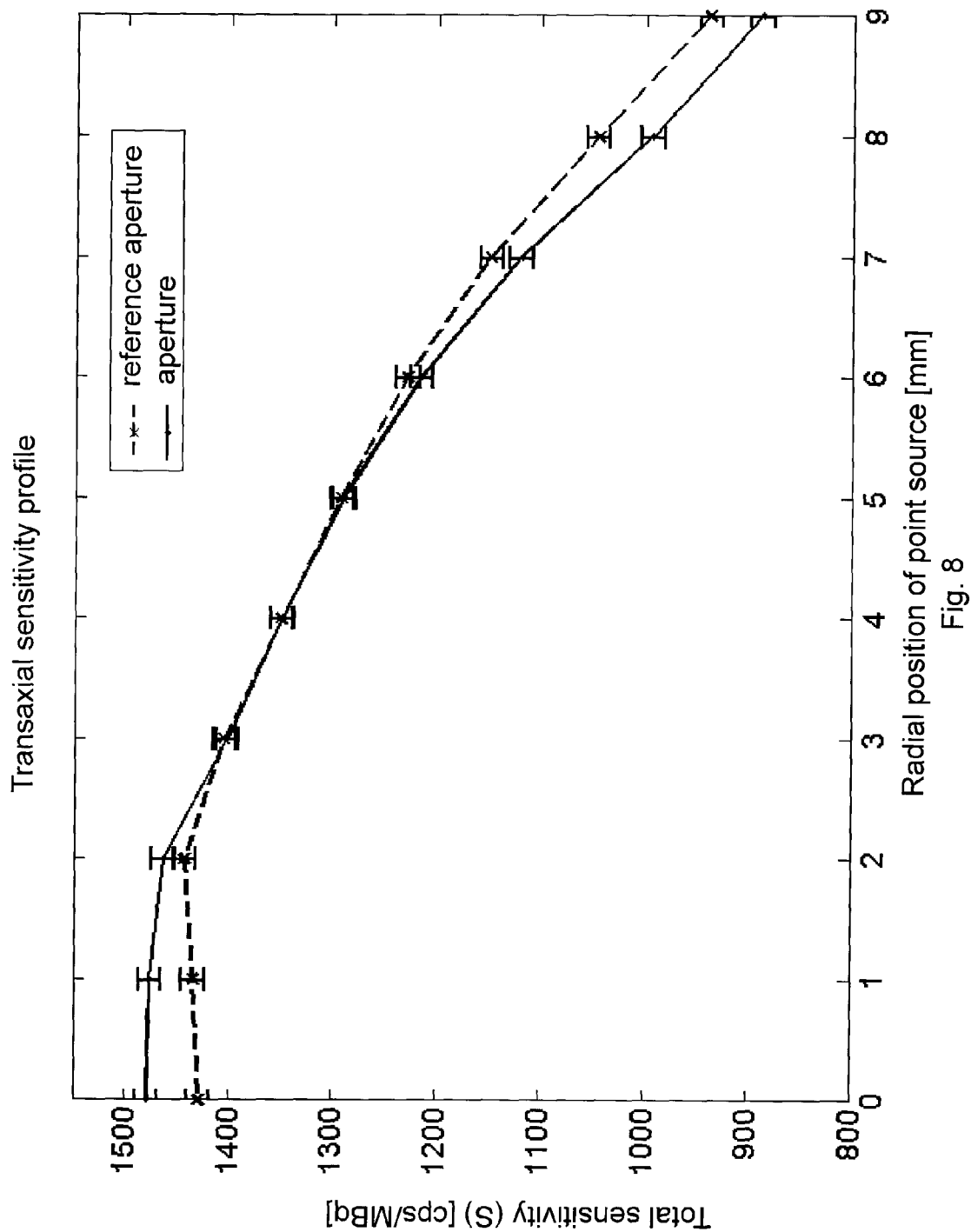
FIG. 8 is the chart of a transaxial sensitivity profile obtained by applying one embodiment of the invention, depicting the sensitivity profile obtained by the prior art apparatus.

We have modelled by computer the imaging apparatuses implemented by an aperture obtained by the above transformation with and by the reference aperture. In the course of modelling, we have prepared the GATE model (http://opengatecollaboration.org/) of the unit formed by the detector device and the aperture, which comprises the aperture in a voxelised form, i.e. divided into elementary volumes. The GATE programme is a validated tool for the modelling of systems of emission tomography and it is able to calculate with a high accuracy the transport of gamma photons by Monte Carlo algorithms. We have adjusted the detector device/aperture model built up in the GATE in a way that it should make 120 views of the activity distribution in the volume of interest, while it turns in 360 degrees. From the 140 keV photon emitting point source placed into the volume of interest, we have made a SPECT simulation series by means of the model, and in each simulation we have only changed the spatial examination position of the point source starting from the centre (radius=0 mm) up to the edge of the volume of interest (radius=15 mm). FIG. 8 shows the trans-axial direction profile curve of the total sensitivity of images made by the reference aperture and the aperture manufactured by the method according to the invention.

On the basis of the curves in FIG. 8 it can be seen that by the slight shifting of the focal openings, the total sensitivity $S_t$ has increased significantly in the region close to the centre of rotation. On the basis of the curve obtained by modelling, the expected resolution is also significantly improved in this region. In accordance with the equation $\Delta=0$ defining the primary volume of interest, the diameter of primary volume of interest is approx. 8 mm. Accordingly, the boundary of primary volume of interest can be found at approx. 4 mm deviation from the starting position in the curve of FIG. 8, i.e. a sensitivity increase can be seen in the 0 to 3 mm range concerning the primary volume of interest, and in the 3 to 4 mm range a stagnation is characteristic. It can be seen on the basis of the above that the primary volume of interest is projected by the imaging apparatus according to the invention with a higher sensitivity than the prior art solutions. Therefore, the modelled embodiment of the imaging apparatus according to the invention is expressly suitable e.g. for performing cardiac examinations on mice.

According to the discussion above, if in comparison with the volume of interest the projection of a relatively small primary volume of interest is the task, where outside the primary volume of interest a substantial activity is not expected (for example, a thyroid gland scan or mouse/rat cerebral examinations), by means of the method according to the invention generally such an aperture can be defined and such an imaging apparatus can be implemented which have appropriate magnification, sensitivity and resolution.

Figure 9:
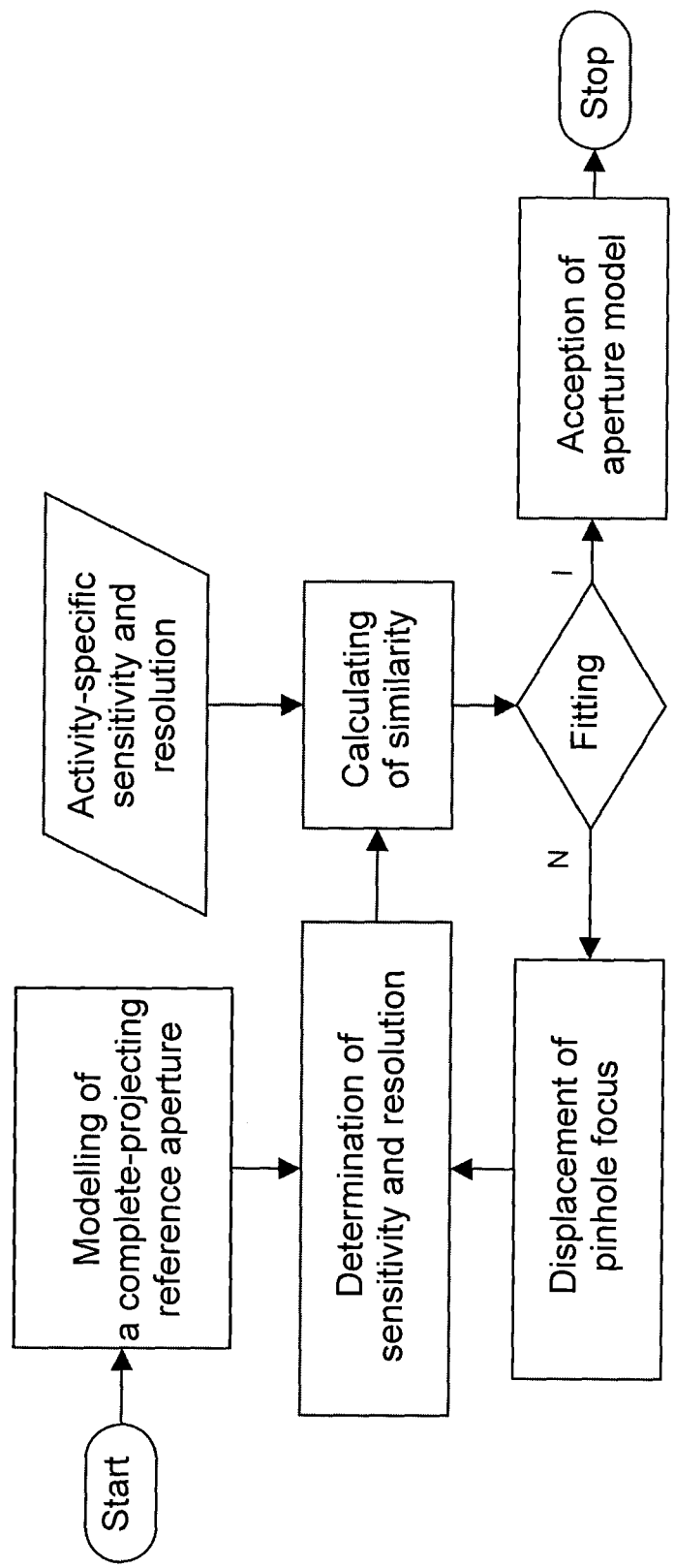
FIG. 9 is a flow diagram depicting the manufacturing method of the aperture of the imaging apparatus according to the invention.

FIG. 9 is the flow diagram of an embodiment of the method for manufacturing an aperture according to the invention. According to the first step of the method, a complete projection reference aperture with pinholes is modelled. Central pinholes and peripheral pinholes are selected from the pinholes. Next, in this embodiment the sensitivity and resolution achieved by the reference aperture and the associated detector device are determined. Next, in this embodiment a cycle is entered, in which, setting out from the reference aperture, an aperture having parameters more appropriately matched than the reference aperture for an appropriate sampling of the activity distribution measurable in the volume of interest is determined. Accordingly, such an aperture is defined, the sensitivity and resolution obtainable with which and with the matched detector device changes according to the spatial distribution of the photon emitting material in the volume of interest compared to the reference aperture. Consequently, using the aperture defined according to the invention, a more advantageous projection for the sampling of the photon emitting material distribution can be implemented from the aspect of the given examination than with the reference aperture.

The above cycle consists of the following steps. As discussed above, first the sensitivity and resolution obtainable by the aperture and the associated detector device in the actual condition of the aperture is calculated by way of example by the computer model. The total sensitivity and the total resolution and the sensitivity distribution as well as the resolution distribution can be calculated, and on the basis of both a conclusion can be drawn whether they are better matched to the activity distribution in the volume of interest, this is done in the next step of the cycle, when calculating the similarity. At the time of calculating similarity, the gradient method which takes into consideration the changing of the sensitivity and resolution as specified in the formulae above or arbitrarily a different multi-variant non-linear numerical extreme value calculation algorithm can be applied. If appropriate matching is obtained by the calculation, the cycle can be terminated and the actual aperture parameters accepted. If the match is inappropriate, the focal openings of each central pinhole and/or peripheral pinhole are further displaced or in the first cycle they are displaced compared to the reference aperture along the main axis of each pinhole. For the aperture so obtained, the first step of the cycle is repeated, i.e the sensitivity and resolution obtainable by applying the aperture are calculated, and then the further steps of the cycle are repeated. When appropriate matching is obtained by means of the aperture transformations applied in the cycle, the aperture is accepted with the actual parameters, i.e. it is made on the basis of the model in the case of computer modelling, using the pinhole arrangement obtained by means of the iteration applied in the cycle.

In some embodiments of the method according to the invention and serving for manufacturing the aperture, the pinholes are displaced as follows. The focal opening of at least one central pinhole is displaced closer to the inlet surface, and the focal opening of at least one peripheral pinhole is displaced away from the inlet surface. In some of these embodiments, at least some of the focal openings of central pinholes are displaced closer to the inlet surface of the aperture in a way that the central pinholes perform the complete projection of the primary volume of interest being a part of the volume of interest. On the basis of these embodiments of the method for manufacturing an aperture according to the invention, the apertures 16 and 48 shown in FIGS. 1 and 2, and in FIGS. 6 and 7, respectively, can be manufactured.

In other embodiments of the method for manufacturing an aperture according to the invention, the focal opening of at least one central pinhole is displaced away from the inlet surface, and the focal opening of at least one peripheral pinhole is displaced closer to the inlet surface. By means of an imaging apparatus implemented with the aperture manufactured in accordance with such embodiments, the volumes of interest comprising a homogenous activity can be advantageously examined according to the discussion above.

In some embodiments of the invention, the detector device comprises a scintillation crystal converting the photons projected to the impact surface into light scintillations, and photodetectors arranged on the side of the scintillation crystal opposite to the impact surface and suitable for determining locations of light scintillations. The operating principle of the detector device comprising the scintillation crystal and the photodetectors is as follows. On the impact surface of the detector device, the (characteristically gamma) photons entering the scintillation crystal interact with the scintillation crystal. As a result, their total energy or a part thereof is converted into the optical wavelength range, i.e. light scintillations are generated. These light scintillations are detected by the photodetector matrix (characteristically a matrix of photoelectron multipliers) placed behind the scintillation crystal and then they are converted into voltage pulses by appropriate signal processing circuits, from the said pulses, digital signals are formed by AD (analogue/digital) converters. Appropriate algorithms are applied to determine the location of light scintillations on the basis of the digital signals. By appropriately calibrated detector device, the point of incidence can be determined by means of the detector device on the basis of the locations of light scintillations. These events determine the values of pixels in the recorded image, i.e. the projection image. By all orientations of the imaging apparatus are set, a projection image is taken within the given time. A single projection image or a series of projection images represent the starting data of characteristically spatial reconstruction method. It is the object of the reconstruction method to generate the activity distribution of the volume of interest on the basis of the projection images and the available information (e.g. a CT-based attenuation map) in a quantitatively correct way.

Figure 10:
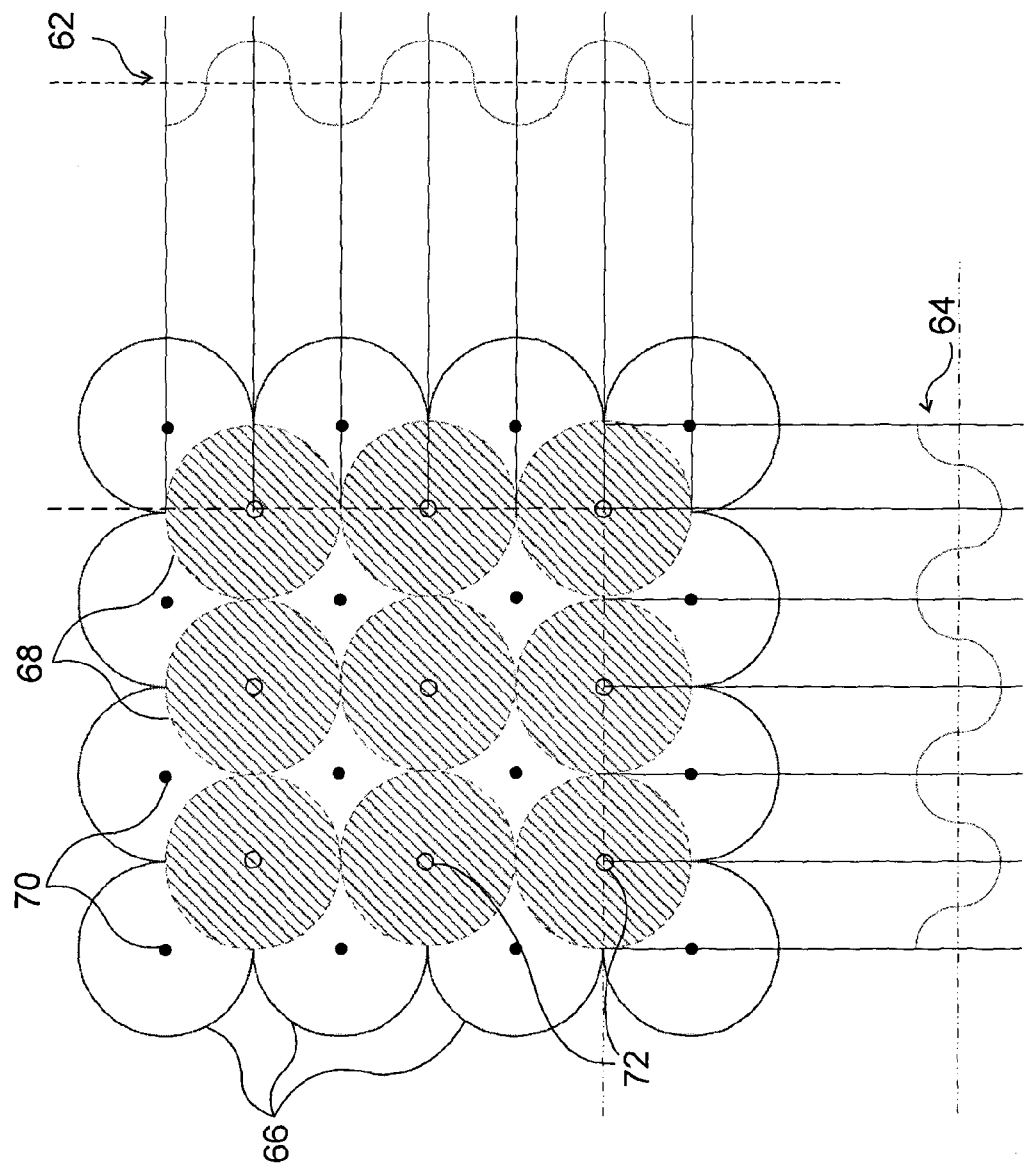
FIG. 10 is a photodetector and image segment arrangement applied in one embodiment of the imaging apparatus according to the invention, depicting the intrinsic resolution curve of the detector device.

In FIG. 10 such a detail of an embodiment of the imaging apparatus according to the invention is shown, where the detector device comprises a scintillation crystal and the photodetectors 66. The photodetectors 66 are of circular shape, but the embodiments of the imaging apparatus according to the invention which comprise photodetector and detailed in FIG. 10 can be implemented also with a different photodetector, which has by way of example a square or rectangular shape.

In the embodiment depicted in FIG. 10, the detector device comprises a scintillation crystal having parallel flat sides, the impact surface is formed on one flat side of the scintillation crystal, and the photodetectors 66 are arranged centrally to grid points 70 of a regular grid along the scintillation crystal flat side opposite to the impact surface, and the photons are projected by the pinholes centrally onto image segments 68 formed on the impact surface centred on central points 72 of areas between the grid points 70, i.e. the images projected to the impact surface are located centrally to the central points 72. Accordingly, the arrangement of the photodetectors 66 and the image segments 68 in FIG. 10 are plotted from the aperture side of the detector device, i.e. from the impact surface. The scintillation crystal arranged between the image segments 68 and the photodetectors 66 is not shown in FIG. 10. It is shown in FIG. 10 that in this embodiment of the invention, the circular photodetectors 66 are arranged in the grid points 70 of a square grid in a way that their diameters are equal to the grid distance, i.e. the photodetectors 66 are in contact. The image segments 68 are arranged on the impact surface opposite the photodetectors 66, exactly in the centre of the area between the photodetectors 66, to the grid points of the also regular square grid, i.e. centrally to the central points 72.

The arrangement shown in FIG. 10 is advantageous because according to the discussion below, in such a relationship between the photodetectors 66 and the image segments 68, the local resolution can be further improved. The characteristic resolution of photodetectors 66 can be characterised along the vertical dotted line with characteristic curve 62, and along the horizontal dotted and broken line with characteristic curve 64. Corresponding to the characteristic curves 62, 64, locally the largest rate of resolution can be measured in the vicinity of the grid points 70 of each photodetector 66, and around the central points 72 the smallest, i.e. most favourable, rate of resolution. Accordingly, the intrinsic resolution $R_i$ is not homogenous, but it changes periodically according to the characteristic curves 62 and 64.

The interrelated arrangement of photodetectors 66 and image segments 68 can be applied advantageously because of the following. In this arrangement, the places of light scintillations determining the point of incidence of each photon are determined on the basis of the signals of four photodetectors 66 surrounding the given image segment 68, e.g. by a centre of gravity based calculation, the so-called Anger method. Therefore, from the signal of the photodetectors 66 surrounding the given image segment 68, the two co-ordinates i.e. a pair of coordinates (x, y) of light scintillations characterising the planes parallel with the flat planes of the scintillation crystal can be determined by centre of gravity calculation. By means of a correction deducted from the appropriate calibration of the detector device, it can be determined which pair of co-ordinates are associated in reality with the obtained pair of co-ordinates (x, y) on the impact surface.

By means of a reconstruction device, the spatial distribution of photon emitting material in the volume of interest can be determined on the basis of the distribution of points of incidences of the photons identified on the impact surface, i.e. the projection images. Accordingly, in order to make sure that with the fluctuation of the resolution of the photodetectors 66 the best possible resolution is achieved about the important parts of the volume of interest, i.e. about the primary volume of interest or about its parts around the centre of rotation, it is advisable to divide the impact surface of the detector device into image segments according to the discussion above. In this case, the structure of the image segments is adjusted to the structure of photodetectors, i.e. to the change in the local intrinsic resolution of the detector device implemented by photodetectors. The centre of image segments is aligned with the lowest, i.e. most favourable resolution points.

It is a characteristic of the method suitable, by way of example the Anger method, for determining the points of incidence of the photons, that the place of light scintillation can be determined with the best accuracy if the detected light scintillation is in the central point 72 or its vicinity, because in this case the signals of the photodetectors 66 closest to the light scintillation are approximately identical. Therefore, by means of the arrangement described above, the central parts of the volume of interest by way of example the primary volume of interest or the parts around the centre of rotation can be projected with the best resolution. Accordingly, the detector device formed according to the current embodiment can be applied especially advantageously in the case of projections where the substantial activity is in the primary volume of interest and there is no significant activity outside the primary volume of interest.

Instead of the round shaped photodetectors, for example, square, rectangular, triangle or hexagonal shaped photodetectors can be applied. With photodetectors of such a shape, the scintillation crystal flat side opposite the impact surface can be covered without dead space. However, even in this case the image segments are advantageously defined centrally to the points which are at equal distances from the centres of photodetectors. When the detector device is formed according to the current embodiment, the fluctuation of the intrinsic resolution causes a smaller artificial product in the reconstructed image.

The distributions of image characteristics, i.e. those of the total sensitivity $S_t$ and total resolution $R_t$ can also be tuned by changing the diameter ($D_{eff}$) of the focal openings of pinholes, i.e. making them dependent on the position of the given pinhole within an aperture. By way of example, the size of the focal opening of peripheral pinholes can be increased. In this case the total sensitivity $S_t$ will also increase, primarily at the edges of the volume of interest, while the value of the above introduced $\Delta$ parameter decreases, and as a result the size of primary volume of interest will also be reduced. However, if the size of focal openings of the central pinholes is increased compared to the size of the focal openings of peripheral pinholes, the sensitivity will improve in the centre of the volume of interest, i.e. close to the centre of rotation, in the primary volume of interest.

Accordingly, in each embodiment according to the invention, e.g in the embodiments demonstrated above, the focal opening of each pinhole is formed with an identical size. In certain further embodiments, however, the focal openings of at least some of the central pinholes and the focal openings of at least some of the peripheral pinholes are formed with different sizes. In the latter embodiments, the distribution of the sensitivity and the resolution can be tuned by changing the sizes of focal openings.

According to the invention, it is possible to form optimal imaging apparatuses and associated apertures to given application fields. According to the invention, at the same time it also becomes possible to form imaging apparatuses which regarding the imaging parameters the image characteristics of prior art apparatuses are substantially exceeded, and therefore an apparatus realizes even a sensitivity of 10000 MBq or even a reconstructed resolution of 250 μm (measurable on a Derenzo phantom) is allowed to be constructed.

By means of the imaging apparatus according to the invention, rotating the detector device and the associated aperture statically in relation to each other, around a centre of rotation projections can be made from the volume of interest. By means of the imaging apparatus according to the invention, even with projections implemented by a stationary detector device and aperture an appropriate image can be taken of the volume of interest. The imaging apparatus according to the invention is able to project all points of the volume of interest with the required sampling density, if it is appropriately formed as discussed above. In the imaging apparatus according to the invention, each point of the volume of interest is appropriately 'seen' by as many pinholes as possible, but at least one, i.e. the pinhole projects it to the detector device.

The invention is, of course, not limited to the preferred embodiments described in details above, but further variants, modifications and developments are possible within the scope of protection determined by the claims.

The invention claimed is:

1. An imaging apparatus comprising:
   a detector device for determining points of incidence of photons and having an impact surface, and
   an aperture for projecting the photons to the detector device, having an inlet surface and an outlet surface facing the impact surface, and comprising pinholes connecting the inlet surface and the outlet surface,
   characterised in that
   the pinholes comprise one or more central pinholes and one or more peripheral pinholes, and
   at least one central pinhole and at least one peripheral pinhole are formed with focal opening depths different from each other, wherein a focal opening of the at least one central pinhole is located closer to the inlet surface than a focal opening of the at least one peripheral pinhole.

2. The apparatus according to claim 1, characterised in that the focal opening of at least one central pinhole is located farther from the inlet surface than the focal opening of at least one peripheral pinhole.

3. The apparatus according to claim 1 characterised in that the pinholes are formed to implement jointly a complete projection of a volume of interest.

4. The apparatus according to claim 3, characterised in that the one or more central pinholes are formed to implement a complete projection of a primary volume of interest being a part of the volume of interest.

5. The apparatus according to claim 1 characterised in that the detector device comprises a scintillation crystal converting the photons projected to the impact surface into light scintillations, and photodetectors arranged on the side of the scintillation crystal opposite the impact surface and suitable for determining locations of light scintillations.

6. The apparatus according to claim 5, characterised by comprising a scintillation crystal having parallel flat sides, the impact surface is formed on one flat side of the scintillation crystal, and the photodetectors are arranged centrally to grid points of a regular grid along the scintillation crystal flat side opposite the impact surface and the photons are projected by the pinholes onto image segments formed on the impact surface centred on central points of areas between the grid points.

7. The apparatus according to claim 1, characterised in that the pinholes have a conic or pyramid shape, and the shapes of the inlet window, outlet window and the focal opening of the pinholes are planar and can be transformed into each other by affine transformation.

8. The apparatus according to claim 1, characterised in that image segments are arranged without overlapping in the same number as the pinholes in accordance with the projection of the pinholes on the impact surface.

9. An aperture for an imaging apparatus, which aperture is suitable for the imaging of photons,
has an inlet surface and an outlet surface, and
comprises pinholes connecting the inlet surface and the outlet surface,
characterised in that
the pinholes comprise one or more central pinholes and one or more peripheral pinholes, and
at least one central pinhole and at least one peripheral pinhole are formed with focal opening depths different from each other, wherein a focal opening of the at least one central pinhole is located closer to the inlet surface than a focal opening of the at least one peripheral pinhole.

10. The aperture according to claim 9, characterised in that the focal opening of at least one central pinhole is located farther from the inlet surface than the focal opening of at least one peripheral pinhole.

11. The aperture according to claim 9, characterised in that the pinholes are formed to jointly implement a complete projection of a volume of interest.

12. The aperture according to claim 11, characterised in that one or more central pinholes are formed to implement a complete projection of a primary volume of interest being a part of the volume of interest.

13. The aperture according to claim 9, characterised in that the pinholes have a conic or pyramid shape, and the shapes of the inlet window, outlet window and focal opening of the pinholes are planar and can be transformed into each other by affine transformation.

14. A method for manufacturing an aperture of an imaging apparatus comprising
modelling a reference aperture suitable for projecting photons, having an inlet surface and an outlet surface, and comprising pinholes connecting the inlet surface and the outlet surface, said reference aperture comprising pinholes with focal openings formed at equal distances from the inlet surface
characterised by
selecting one or more central pinholes and one or more peripheral pinholes from the pinholes,
defining an aperture by displacing in relation to the inlet surface along main axes of the pinholes the focal opening of at least one central pinhole and/or the focal opening of at least one peripheral pinhole, wherein a focal opening of the at least one central pinhole is displaced closer to the inlet surface and a focal opening of the at least one peripheral pinhole is displaced away from the inlet surface, and
forming the defined aperture.

15. The method according to claim 14, characterised by determining sensitivity and/or resolution obtainable by the reference aperture and a detector device, by matching the detector device to the reference aperture, and
displacing in relation to the inlet surface along the main axes of the pinholes the focal opening of at least one central pinhole and/or the focal opening of at least one peripheral pinhole, so that the sensitivity and/or resolution obtainable by the determined aperture and the matched detector device are altered in accordance with the spatial distribution of a photon emitting material being in the volume of interest.

16. The method according to claim 14, characterised in that the focal opening of at least one central pinhole is displaced away from the inlet surface and the focal opening of at least one peripheral pinhole is displaced closer to the inlet surface.

17. An imaging apparatus, comprising:
a detector device configured to determine points of incidence of photons and having an impact surface;
an aperture configured to project the photons to the detector device having an inlet surface and an outlet surface facing the impact surface; and
pinholes connecting the inlet surface and the outlet surface and including one or more central pinholes and one or more peripheral pinholes, wherein at least one central pinhole and at least one peripheral pinhole are formed with focal opening depths different from each other and a focal opening of the at least one central pinhole is located farther from the inlet surface than a focal opening of the at least one peripheral pinhole.

18. An aperture for an imaging apparatus, comprising:
an inlet surface and an outlet surface; and
pinholes connecting the inlet surface and the outlet surface and including one or more central pinholes and one or more peripheral pinholes, wherein at least one central pinhole and at least one peripheral pinhole are formed with focal opening depths different from each other and a focal opening of the at least one central pinhole is located farther from the inlet surface than a focal opening of the at least one peripheral pinhole.

19. A method for manufacturing an aperture of an imaging apparatus, comprising:
modeling a reference aperture suitable for projecting photons having an inlet surface and outlet surface with pinholes connecting the inlet surface and the outlet surface so that focal openings are formed at equal distances from the inlet surface;
selecting one or more central pinholes and one or more peripheral pinholes from the pinholes;
defining an aperture by displacing in relation to the inlet surface along main axes of the pinholes a focal opening of at least one central pinhole and/or a focal opening of at least one peripheral pinhole, wherein the focal opening of the at least one central pinhole is displaced away from the inlet surface and the focal opening of the at least one peripheral pinhole is displaced closer to the inlet surface; and
forming the defined aperture.

* * * * *